(12) United States Patent
Liaw

(10) Patent No.: US 11,222,898 B2
(45) Date of Patent: Jan. 11, 2022

(54) TWO-PORT SRAM STRUCTURE

(71) Applicant: Taiwan Semiconductor Manufacturing Company, Ltd., Hsinchu (TW)

(72) Inventor: Jhon Jhy Liaw, Zhudong Township (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 3 days.

(21) Appl. No.: 16/773,471

(22) Filed: Jan. 27, 2020

(65) Prior Publication Data
US 2020/0161314 A1 May 21, 2020

Related U.S. Application Data

(63) Continuation of application No. 16/188,411, filed on Nov. 13, 2018, now Pat. No. 10,546,864, which is a continuation of application No. 15/089,947, filed on Apr. 4, 2016, now Pat. No. 10,128,253.

(60) Provisional application No. 62/288,789, filed on Jan. 29, 2016.

(51) Int. Cl.
| | | |
|---|---|---|
| H01L 27/11 | (2006.01) | |
| G11C 8/16 | (2006.01) | |
| G11C 11/419 | (2006.01) | |
| H01L 23/528 | (2006.01) | |

(52) U.S. Cl.
CPC ............ *H01L 27/1104* (2013.01); *G11C 8/16* (2013.01); *G11C 11/419* (2013.01); *H01L 23/528* (2013.01); *H01L 27/1116* (2013.01)

(58) Field of Classification Search
CPC ............ H01L 27/1104; H01L 27/1116; H01L 23/528; G11C 8/16; G11C 11/419
See application file for complete search history.

(56) References Cited

U.S. PATENT DOCUMENTS

| | | |
|---|---|---|
| 7,269,056 B1 | 9/2007 | Liaw |
| 8,605,523 B2 | 12/2013 | Tao et al. |
| 8,630,132 B2 | 1/2014 | Cheng et al. |
| 8,760,948 B2 | 6/2014 | Tao et al. |
| 8,779,528 B2 | 7/2014 | Liaw |

(Continued)

FOREIGN PATENT DOCUMENTS

| | | |
|---|---|---|
| CN | 101064297 A | 10/2007 |
| JP | 2005116982 A | 4/2005 |

(Continued)

*Primary Examiner* — Nathan W Ha
(74) *Attorney, Agent, or Firm* — Slater Matsil, LLP

(57) ABSTRACT

An integrated circuit structure includes a Static Random Access Memory (SRAM) cell, which includes a read port and a write port. The write port includes a first pull-up Metal-Oxide Semiconductor (MOS) device and a second pull-up MOS device, and a first pull-down MOS device and a second pull-down MOS device forming cross-latched inverters with the first pull-up MOS device and the second pull-up MOS device. The integrated circuit structure further includes a first metal layer, with a bit-line, a CVdd line, and a first CVss line in the first metal layer, a second metal layer over the first metal layer, and a third metal layer over the second metal layer. A write word-line is in the second metal layer. A read word-line is in the third metal layer.

20 Claims, 15 Drawing Sheets

(56) References Cited

U.S. PATENT DOCUMENTS

| | | | |
|---|---|---|---|
| 9,478,553 B2 | 10/2016 | Liaw | |
| 9,515,077 B1* | 12/2016 | Liaw | H01L 29/1095 |
| 10,128,253 B2* | 11/2018 | Liaw | H01L 27/1104 |
| 2001/0021123 A1 | 9/2001 | Kumagai et al. | |
| 2004/0151041 A1 | 8/2004 | Lee et al. | |
| 2004/0238892 A1 | 12/2004 | Jung et al. | |
| 2004/0262635 A1 | 12/2004 | Lee | |
| 2005/0099865 A1 | 5/2005 | Hatate et al. | |
| 2006/0050586 A1* | 3/2006 | Ohtsuki | G11C 11/419 365/104 |
| 2006/0158926 A1 | 7/2006 | Yokoyama | |
| 2006/0170023 A1 | 8/2006 | Nikaido et al. | |
| 2006/0171189 A1 | 8/2006 | Abadeer et al. | |
| 2006/0203530 A1 | 9/2006 | Venkatraman et al. | |
| 2006/0215441 A1 | 9/2006 | Matsushige et al. | |
| 2006/0274569 A1 | 12/2006 | Joshi et al. | |
| 2007/0002617 A1 | 1/2007 | Houston et al. | |
| 2007/0063288 A1 | 3/2007 | Furuta et al. | |
| 2007/0069267 A1* | 3/2007 | Matsuda | H01L 27/1104 257/301 |
| 2009/0207642 A1 | 8/2009 | Shimano et al. | |
| 2009/0244950 A1 | 10/2009 | Nii | |
| 2012/0063202 A1 | 3/2012 | Houston et al. | |
| 2013/0258759 A1 | 10/2013 | Liaw | |
| 2014/0032871 A1 | 1/2014 | Hsu et al. | |
| 2014/0153321 A1 | 6/2014 | Liaw | |
| 2014/0153345 A1 | 6/2014 | Kim et al. | |
| 2014/0177352 A1 | 6/2014 | Lum | |
| 2014/0198573 A1 | 7/2014 | Jung et al. | |
| 2014/0233330 A1 | 8/2014 | Ko et al. | |
| 2014/0241077 A1 | 8/2014 | Katoch et al. | |
| 2014/0269114 A1 | 9/2014 | Yang et al. | |
| 2014/0347908 A1* | 11/2014 | Liaw | H01L 27/1104 365/72 |
| 2016/0163714 A1 | 6/2016 | Mojumder et al. | |
| 2016/0276331 A1* | 9/2016 | Liaw | H01L 27/1124 |

FOREIGN PATENT DOCUMENTS

| | | |
|---|---|---|
| KR | 20140016797 A | 2/2014 |
| KR | 20140092027 A | 7/2014 |
| TW | 201421617 A | 6/2014 |

\* cited by examiner

US 11,222,898 B2

TWO-PORT SRAM STRUCTURE

PRIORITY CLAIM AND CROSS-REFERENCE

This application is a continuation of U.S. application Ser. No. 16/188,411, entitled "Two-Port SRAM Structure," and filed Nov. 13, 2018, which is a continuation of application Ser. No. 15/089,947, entitled "Two-Port SRAM Structure," and filed Apr. 4, 2016, now U.S. Pat. No. 10,128,253 issued Nov. 13, 2018, which claims the benefit of the U.S. Provisional Application No. 62/288,789, entitled "Two-Port SRAM Structure," and filed Jan. 29, 2016, which applications are hereby incorporated herein by reference.

BACKGROUND

Static Random Access Memory (SRAM) is commonly used in integrated circuits. SRAM cells have the advantageous feature of holding data without a need for refreshing. With the increasing demanding requirement to the speed of integrated circuits, the read speed and write speed of SRAM cells also become more important. With the increasingly down-scaling of the already very small SRAM cells, however, such request is difficult to achieve. For example, the sheet resistance of metal lines, which form the word-lines and bit-lines of SRAM cells, becomes increasingly higher, and hence the RC delay of the lines and bit-lines of SRAM cells is increased, preventing the improvement in the read speed and write speed.

When entering into nanometer era, split-word-line SRAM cells have become increasingly popular due to their lithography-friendly layout shapes of active regions, polysilicon lines, and metal layers, and also due to shorter bit-lines for speed improvement. However, in the nanometer era, SRAM cells are also larger, resulting in two problems. Firstly, each bit-line has to be connected to more rows of SRAM cells, which induces higher bit-line metal coupling capacitance, and hence the differential speed of the differential bit-lines (bit-line and bit-line-bar) is reduced. Secondly, each word-line also has to be connected to more columns of SRAM cells, resulting in longer word-lines and hence worsened resistance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
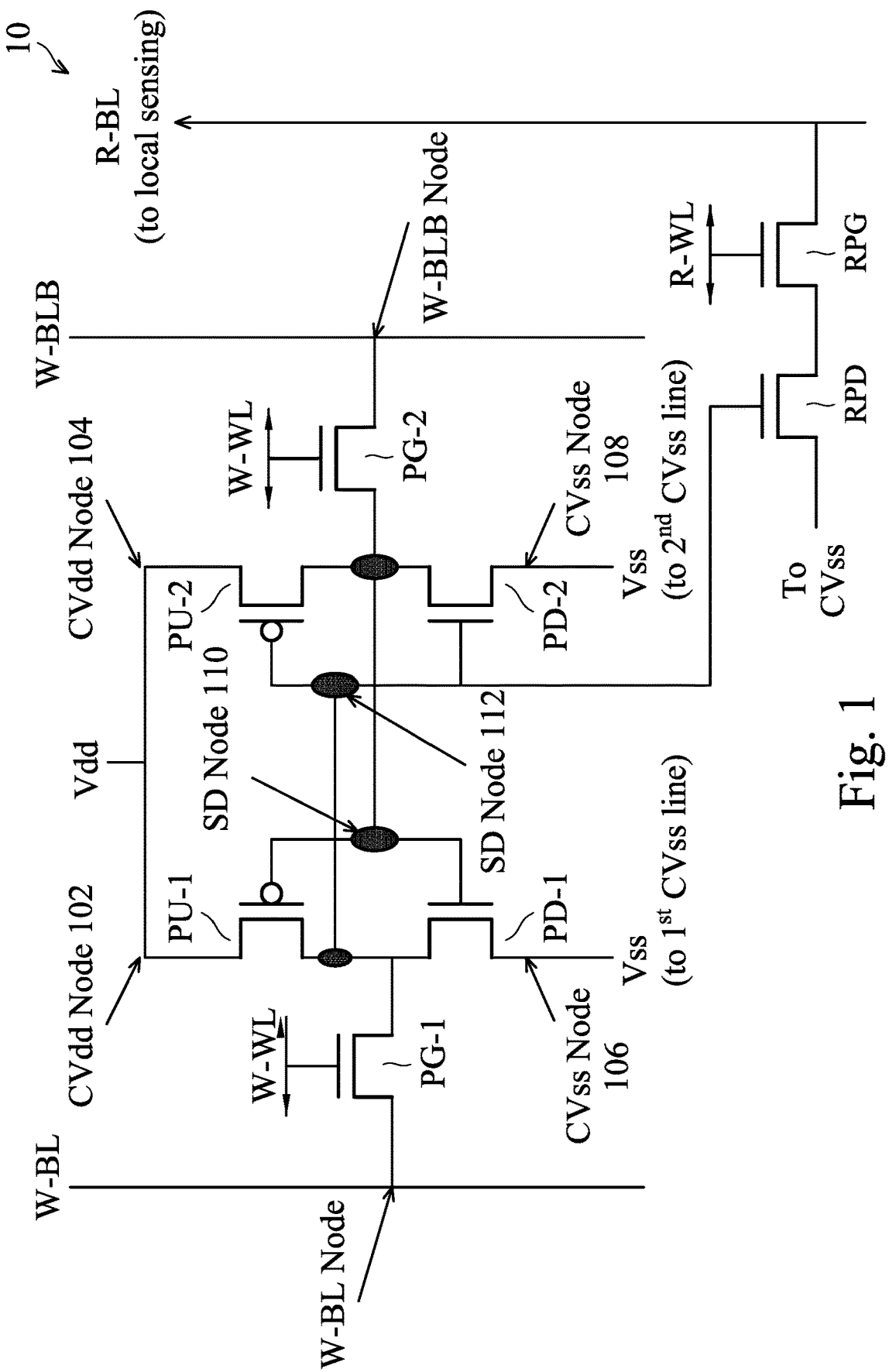
FIG. 1 illustrates a circuit diagram of a two-port eight-transistor (8T) Static Random Access Memory (SRAM) cell in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A two-port Static Random Access Memory (SRAM) cell and the corresponding layout of metal lines in the SRAM cell are provided in accordance with various exemplary embodiments. Some variations of some embodiments are discussed. Throughout the various views and illustrative embodiments, like reference numbers are used to designate like elements.

FIG. 1 illustrates a circuit diagram of a two-port eight-transistor (8T) SRAM cell 10 in accordance with some embodiments. SRAM cell 10 includes a read port and a write port. The write port includes pull-up transistors PU-i and PU-2, which are P-type Metal-Oxide-Semiconductor (PMOS) transistors, and pull-down transistors PD-1 and PD-2 and pass-gate transistors PG-1 and PG-2, which are N-type Metal-Oxide-Semiconductor (NMOS) transistors. The gates of pass-gate transistors PG-1 and PG-2 are controlled by write word-line W-WL that determines whether SRAM cell 10 is selected for writing into or not. A latch formed of pull-up transistors PU-1 and PU-2 and pull-down transistors PD-1 and PD-2 stores a bit, wherein the complementary values of the bit are stored in Storage Data (SD) node no and SD node 112. The stored bit can be written into SRAM cell 10 through complementary bit-lines including write bit-line W-BL and write bit-line-bar W-BLB. SRAM cell 10 is powered through a positive power supply node Vdd that has a positive power supply voltage (also denoted as VDD). SRAM cell 10 is also connected to power supply voltage Vss (also denoted as VSS), which may be an electrical ground. Transistors PU-1 and PD-1 form a first inverter. Transistors PU-2 and PD-2 form a second inverter. The input of the first inverter is connected to transistor PG-i and the output of the second inverter. The output of the first inverter is connected to transistor PG-2 and the input of the second inverter.

The sources of pull-up transistors PU-1 and PU-2 are connected to CVdd node 102 and CVdd node 104, respectively, which are further connected to power supply voltage (and line) Vdd. The sources of pull-down transistors PD-1 and PD-2 are connected to CVss node 106 and CVss node 108, respectively, which are further connected to power supply voltage/line Vss. The gates of transistors PU-1 and PD-1 are connected to the drains of transistors PU-2 and PD-2, which form a connection node that is referred to as SD node 110. The gates of transistors PU-2 and PD-2 are connected to the drains of transistors PU-1 and PD-1, which connection node is referred to as SD node 112. A source/drain region of pass-gate transistor PG-1 is connected to write W-BL at a BL node. A source/drain region of pass-gate transistor PG-2 is connected to word-line W-BLB at a W-BLB node.

Figure 6:
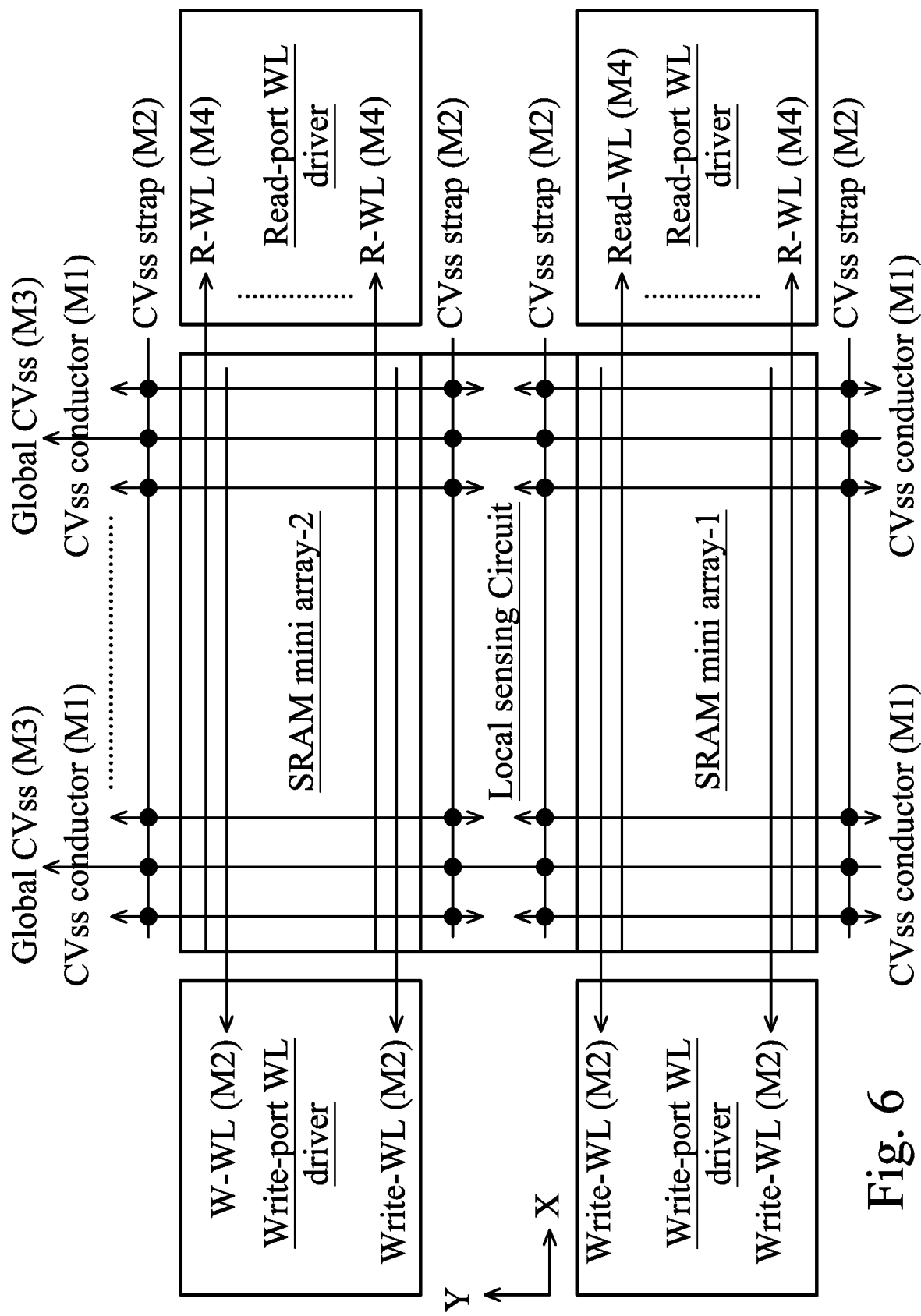
FIG. 6 illustrates mini-arrays in an SRAM array and the respective word-lines and CVss lines in accordance with some embodiments.

SRAM cell 10 further includes a read port, which includes read pull-down transistor RPD and read pass-gate transistor RPG connected in series. The gate of transistor RPD is connected to SD node 112. The gate of transistor RPG is connected to read word-line (R-WL). A source/drain region of transistor RPG is connected to read bit-line R-BL, which is connected to a local sensing circuit (FIG. 6). A source/drain region of transistor RPD is connected to CVss.

Figure 2:
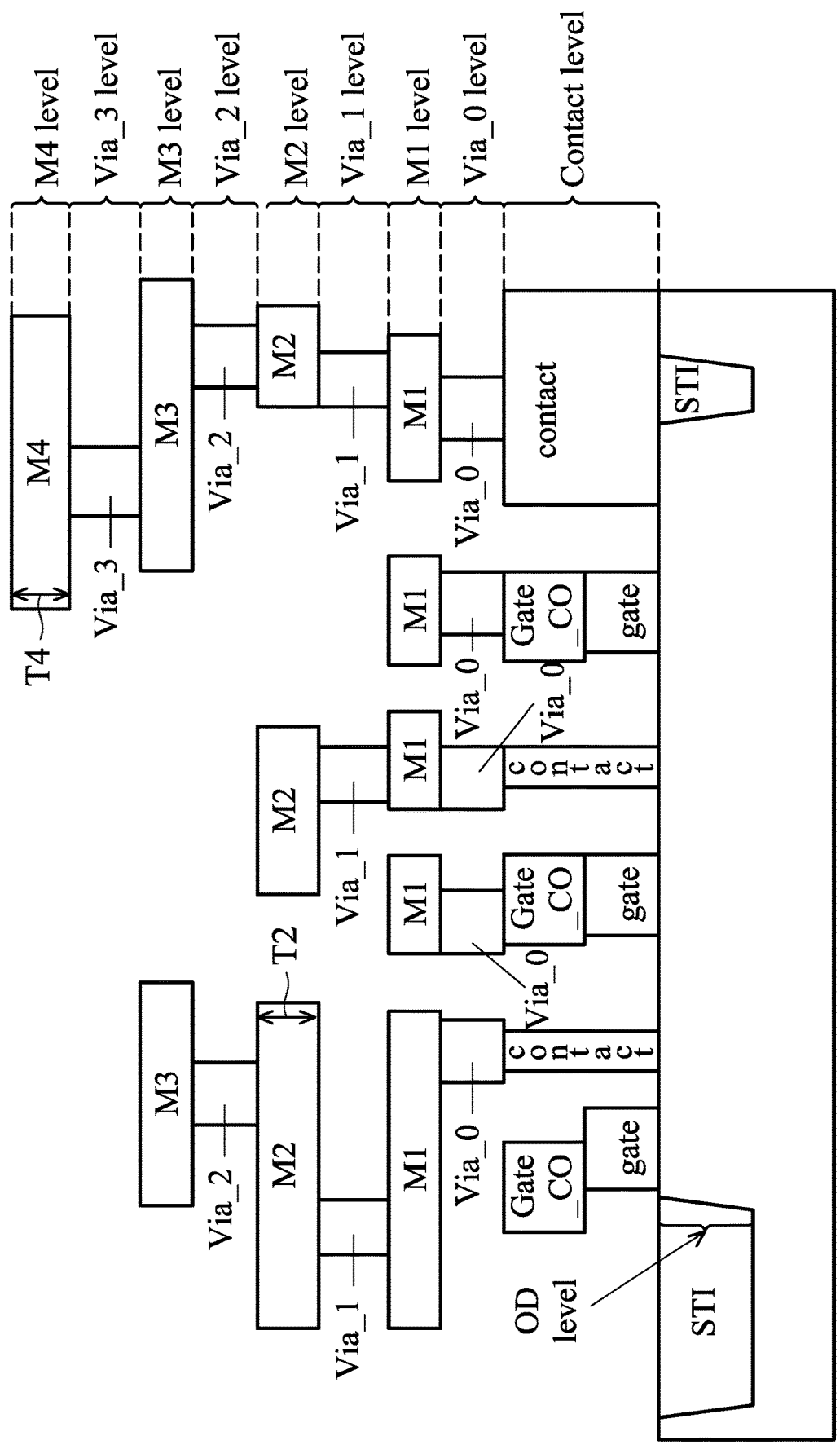
FIG. 2 illustrates a cross-sectional view of the layers involved in an SRAM cell in accordance with some embodiments.

FIG. 2 illustrates a schematic cross-sectional view of a plurality of layers involved in SRAM cell 10, which layers are formed on a semiconductor chip or wafer. It is noted that FIG. 2 is schematically illustrated to show various levels of interconnect structure and transistors, and may not reflect the actual cross-sectional view of SRAM cell 10. The interconnect structure includes a contact level, an OD (wherein the term "OD" represents "active region") level, via levels Via_0 level, Via_1 level, Via_2 level, and Via_3 level, and metal-layer levels M1 level, M2 level, M3 level, and M4 level. Each of the illustrated levels includes one or more dielectric layers and the conductive features formed therein. The conductive features that are at the same level may have top surfaces substantially level to each other, bottom surfaces substantially level to each other, and may be formed simultaneously. The contact level may include gate contacts (also referred to as contact plugs) for connecting gate electrodes of transistors (such as the illustrated exemplary transistors PU-1 and PU-2) to an overlying level such as the Via_0 level, and source/drain contacts (marked as "contact") for connecting the source/drain regions of transistors to the overlying level.

Figure 3:
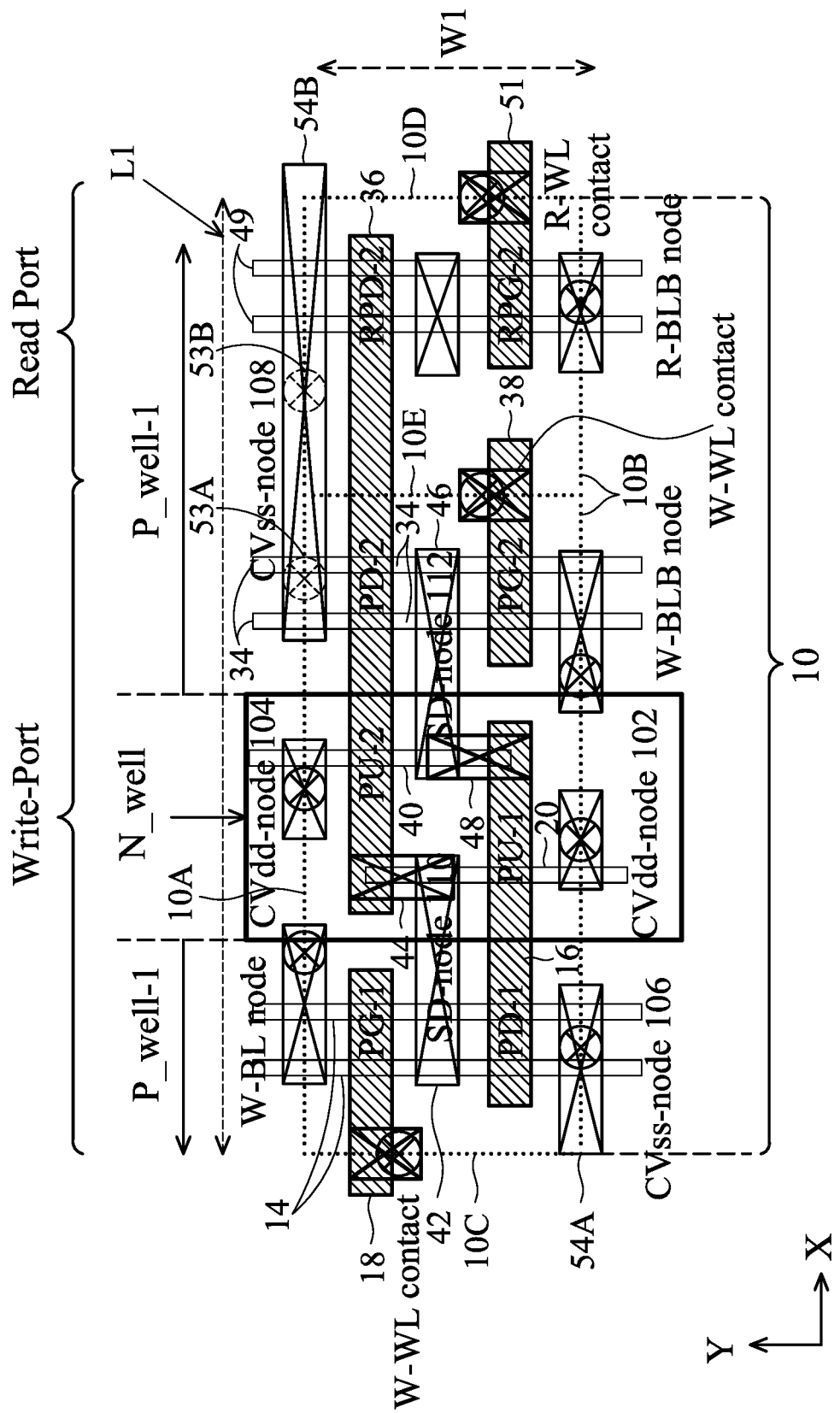
FIG. 3 illustrates a layout of front-end features of a two-port 8T SRAM cell in accordance with some embodiments.

FIG. 3 illustrates a layout of the front-end features of a two-port eight-transistor (8T) SRAM cell 10 in accordance with exemplary embodiments. The front-end features include the features in the Via_0 level (FIG. 1) and the features underlying the Via_0 level. The outer boundaries 10A, 10B, 10C, and 10D of SRAM cell 10 are illustrated using dashed lines, which mark a rectangular region. SRAM cell 10 has length L1 measured in the X direction (row direction), and width W1 measured in the Y direction (column direction). In accordance with some embodiments of the present disclosure, ratio L1/W1 is greater than about 3.5, and hence SRAM cell 10 is elongated in the row direction.

Dashed line 10E is illustrated to show where the read port is joined to the write port. An n_well region is at the middle of the write port of SRAM cell 10, and two p_well regions are on opposite sides of the n_well region. CVdd node 102, CVdd node 104, CVss node 106, CVss node 108, the write bit-line (W-BL) node, and the write bit-line-bar (W-BLB) node, which are shown in FIG. 1, are also illustrated in FIG. 3.

In the write port, gate electrode 16 forms pull-up transistor PU-1 with the underlying active region (in the n-well region) 20, which may be fin-based, and hence are referred to fin 20 hereinafter. Gate electrode 16 further forms pull-down transistor PD-1 with the underlying active regions (in the first p_well region on the left side of the n-well region) 14, which may be fin-based. Gate electrode 18 forms pass-gate transistor PG-1 with the underlying active regions 14. Gate electrode 36 forms pull-up transistor PU-2 with the underlying active region (in the n_well region) 40. Gate electrode 36 further forms pull-down transistor PD-2 with the underlying active region (in the second p_well region on the right side of the n_well region) 34. Gate electrode 38 forms pass-gate transistor PG-2 with the underlying active region 34. In accordance with some embodiments of the present disclosure, pass-gate transistors PG-1 and PG-2, pull-up transistors PU-1 and PU-2, and pull-down transistors PD-1 and PD-2 are Fin Field-Effect Transistors (FinFETs). In accordance with alternative embodiments of the present disclosure, pass-gate transistors PG-1 and PG-2, pull-up transistors PU-1 and PU-2, and pull-down transistors PD-1 and PD-2 are planar MOS devices.

In the read port, gate electrode 36 extends farther to form read pull-down transistor RPD with the underlying active regions 49, which are semiconductor fins in accordance with some embodiments. Gate electrode 51 forms read pass-gate transistor RPG with the underlying active regions 49 also.

FIG. 3 illustrates two fins 14 (and two fins 34 and two fins 49) in accordance with some embodiments. In accordance with other embodiments, there may be a single fin, two fins, three fins, or more for forming the transistors.

As shown in FIG. 3, SD node 110 includes source/drain contact plug 42 and gate contact plug 44, which are the features at the contact level (FIG. 2). Contact plug 42 is elongated and has a longitudinal direction in the X direction, which is parallel to the extending directions of gate electrodes 16 and 36. Gate contact plug 44 comprises a portion over, and is electrically connected to, gate electrode 36. In accordance with some embodiments of the present disclosure, gate contact plug 44 has a longitudinal direction in the Y direction, with is perpendicular to the X direction. At the Manufacturing of the SRAM cell 10 on physical semiconductor wafers, contact plugs 42 and 44 may be formed as a single continuous butted contact plug.

SD node 112 includes source/drain contact plug 46 and gate contact plug 48. Gate contact plug 48 has a portion overlapping source/drain contact plug 46. Since SD node 110 may be symmetric to SD node 112, the details of gate contact plug 48 and source/drain contact plug 46 are not repeated herein, and may be found referring to the discussion of gate contact plug 44 and source/drain contact plug 42, respectively.

FIG. 3 also illustrates write word-line contacts (marked as W-WL contacts) connected to gate electrodes 18 and 38. Throughout the figures, each of contacts (also referred to as contact plugs) is illustrated using a mark including a rectangle with a "x" sign therein. Furthermore, a plurality of vias, each illustrated using a circle and a "x" sign in the circle, is over and contacting the respective underlying contact plugs. Elongated contact plugs 54A and 54B are used to connect the source regions of pull-down transistors PD-1 and PD-2, respectively, to CVss lines. Elongated contact plugs 54A and 54B are parts of the CVss nodes 106 and 108, respectively. Elongated contact plugs 54A and 54B have lengthwise directions parallel to the X direction, and may be formed to overlap the corners of SRAM cell 10. Furthermore, elongated contact plugs 54A and 54B may further extend into neighboring SRAM cells that abut SRAM cell 10.

Elongated contact plug 54B extends into both the read port and the write port. Elongated contact plug 54B is connected to a CVss line(s) at the M1 level through either via_0 level via 53A, via_0 level via 53B, or both. Accordingly, vias 53A and 53B are illustrated as being dashed to show one of them may or may not be omitted. There is also a plurality of features such as R-WL contact. The functions of these features and the corresponding vias and contact plugs may be found from FIG. 3, and hence are not discussed.

Figure 4:
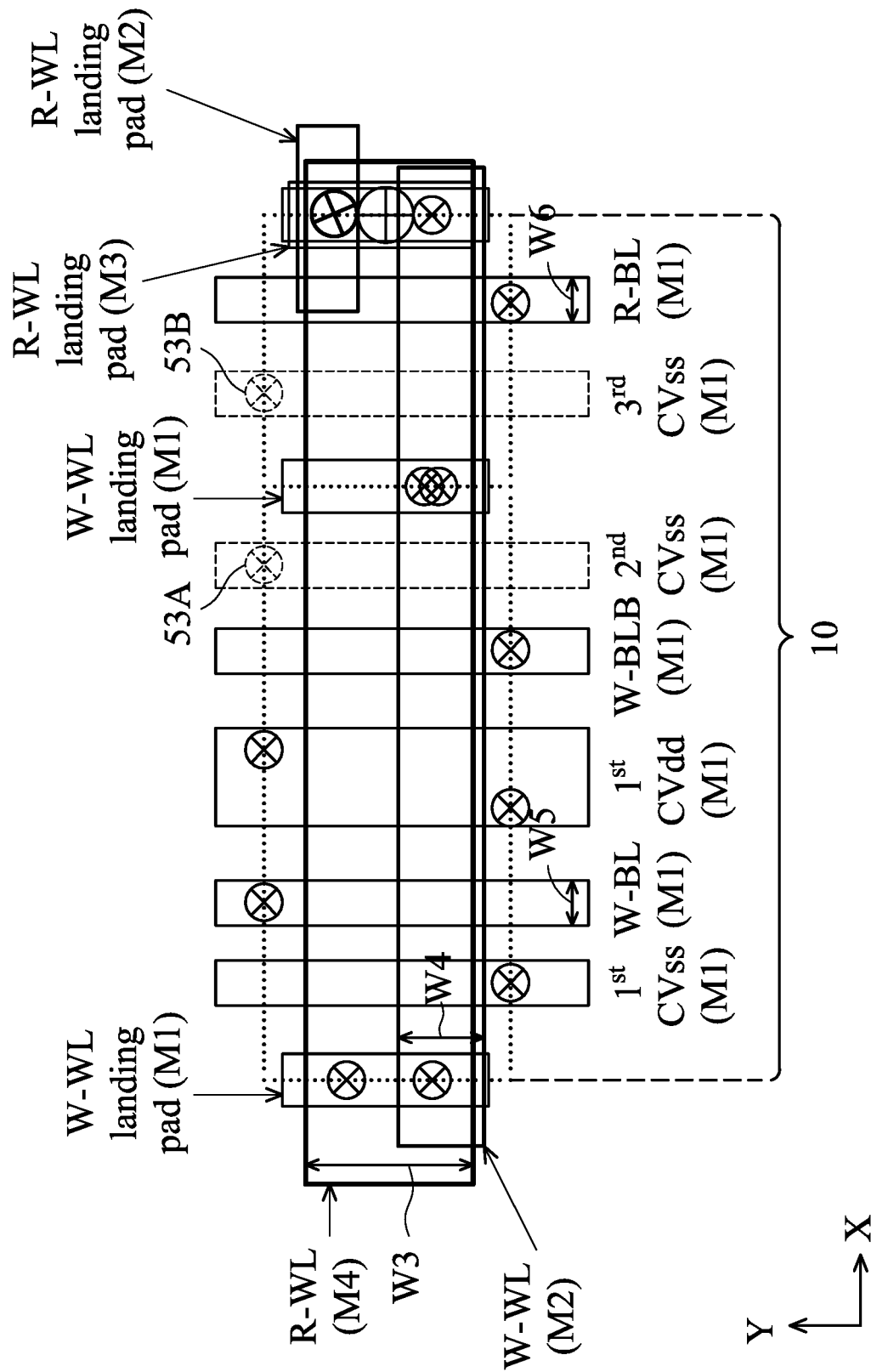
FIG. 4 illustrates a read word-line and a write word-line in an SRAM cell in accordance with some embodiments.

FIG. 4 illustrates the metal lines formed at the M1 level, M2 level, M3 level, and M4 level of SRAM cell 10. Throughout the description, the notations of metal lines may be followed by the metal levels they are in, wherein the respective metal level is placed in parenthesis. As shown in FIG. 4, a first $1^{st}$ CVdd line, a $1^{st}$, a second ($2^{nd}$), and a third ($3^{rd}$) CVss lines, write bit-line W-BL, write bit-line-bar W-BLB, and read bit-line R-BL (also refer to FIG. 1) are disposed at the M1 level (FIG. 2), and have lengthwise directions parallel to the Y direction (column direction). Accordingly, each of these metal lines may extend into, and may be connected to, a plurality of SRAM cells in the same column. Either one or both of the $2^{nd}$ and $3^{rd}$ CVss lines may be formed, and hence the $2^{nd}$ and $3^{rd}$ CVss lines are marked using dashed lines. Correspondingly, either one or both of the Via_0 level vias 53A or 53B may be formed in order to connect to the respective overlying $2^{nd}$ CVss line and $3^{rd}$ CVss line.

Since local sensing is used to measure the signals on read bit-line R-BL, read bit-line R-BL is often very short (for example, R-BL may be 16 times or 32 times the width of a SRAM cell 10 in the Y direction). On the other hand, write bit-line W-BL is a global bit-line, and may have a length equal to, for example, 256 times the width of a SRAM cell 10 (in the Y direction). Accordingly, the resistance of write bit-line W-BL is more critical than read bit-line R-BL, and width W5 of line W-BL may be greater than line width W6 of read bit-line R-BL to reduce its line resistance. Ratio W5/W6 may be greater than about 1.2 in accordance with some embodiments.

Write word-line W-WL and read word-line R-WL are disposed in different metal layers so that their widths may be maximized in order to reduce the resistance. In accordance with some embodiments of the present disclosure, write word-line W-WL is at the M2 level (FIG. 2), and read word-line R-WL is at the M4 level. In accordance with some embodiments, at the M4 level and inside SRAM cell 10, there is a single R-WL without any other metal line. In accordance with some embodiments, the ratio W3/W4, which is the ratio of width W3 of R-WL to width W4 of W-WL is greater than about 1.5. Disposing read word-line R-WL in a higher metal layer and having a greater width than write bit-line W-WL is advantageous for improving the speed of SRAM cell 10 since read operations are performed more than write operations, and hence the read speed is more critical than the write speed.

Since write word-line W-WL is long, to reduce the resistance of W-WL, the thickness of the M2 level, in which W-WL is located, may be increased. For example, referring to FIG. 2, thickness T2 of the M2 level (which is equal to the thickness of W-WL) is increased, and may be greater than thickness T4 of the M4 level (which is equal to the thickness of R-WL). An exemplary ratio of T2/T4 is greater than about 1.3.

Figure 5:
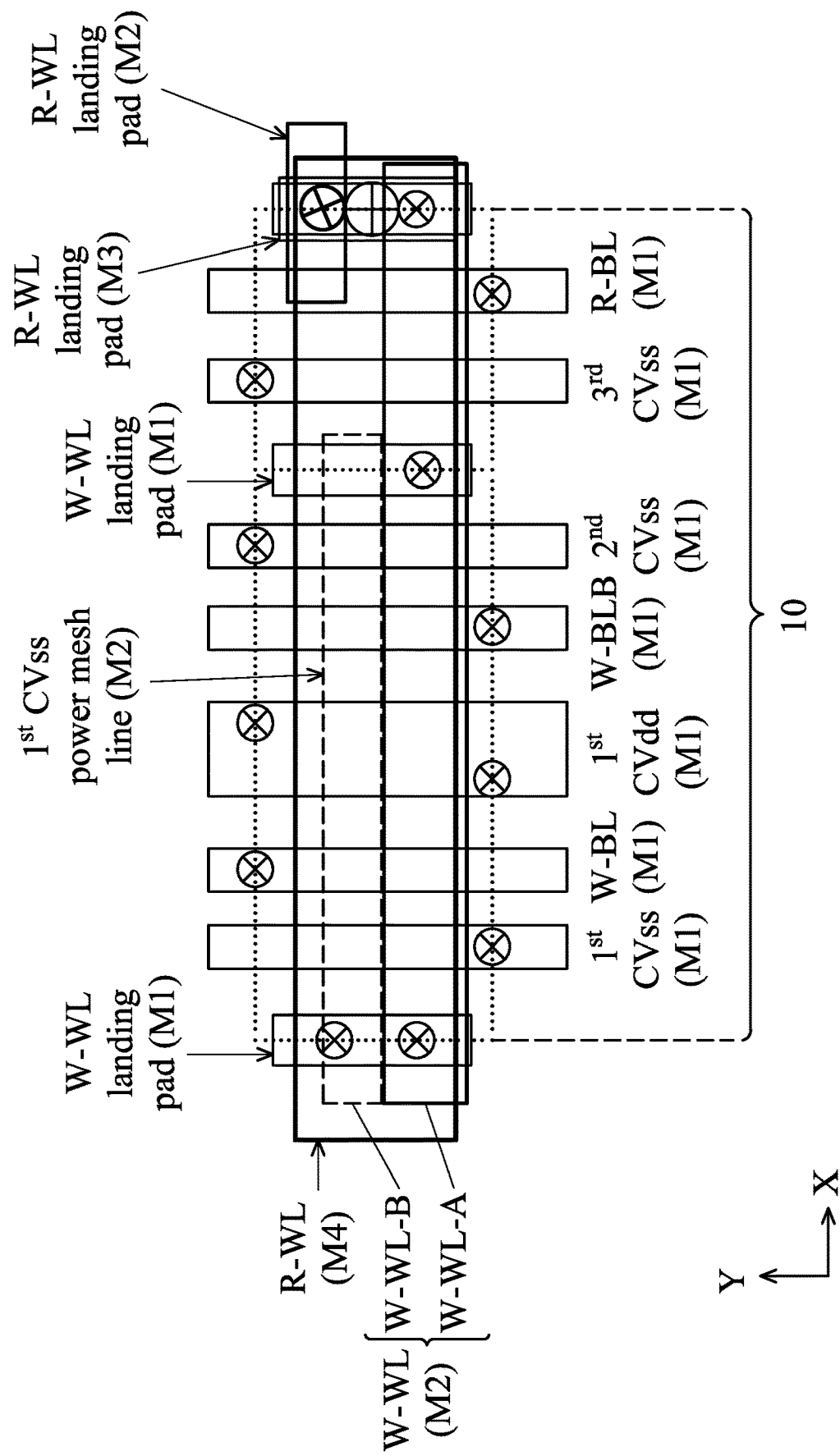
FIG. 5 illustrates a read word-line and a write word-line having a jog in an SRAM cell in accordance with some embodiments.

FIG. 5 illustrates the write word-line W-WL in accordance with some embodiments of the present disclosure. Write word-line W-WL includes strip portion W-WL-A, which is a strip having a rectangular shape extending all the way through SRAM cell 10. Write word-line W-WL includes jog portion W-WL-B on one side of strip portion W-WL-A. The formation of jog portion W-WL-B results in the advantageous increase in the widths of write word-line W-WL, and hence the resistance of write word-line W-WL is further reduced, resulting in an advantageous reduction of RC delay. In accordance with alternative embodiments, write word-line W-WL includes strip portion W-WL-A and does not include jog portion W-WL-B. Accordingly, jog portion W-WL-B is illustrated using dashed lines to indicate it may or may not exist.

FIG. 6 schematically illustrates a CVss power mesh in accordance with some embodiments. For example, an SRAM array includes a plurality of mini-arrays, with mini-array-1 and mini-array-2 illustrated. Each mini-array has more than four columns and more than four rows. Mini-arrays mini-array-1 and mini-array-2 are separated from each other by a local sensing circuit, which is used for sensing (during read operations) the voltages on the bit-lines of the respective mini-array. The mini-arrays are connected to a write-port WL driver(s) and a read-port WL driver(s). FIG. 6 shows that global CVss lines are disposed at the M3 level, and are connected to the CVss lines (strap) at the M2 level. Accordingly, the CVss power mesh is formed. The connection of the global CVss line to the CVss straps may be outside of the mini-array. For example, as shown in FIG. 6, the connection is located in the space between mini-array-1 and mini-array-2.

Figure 7:
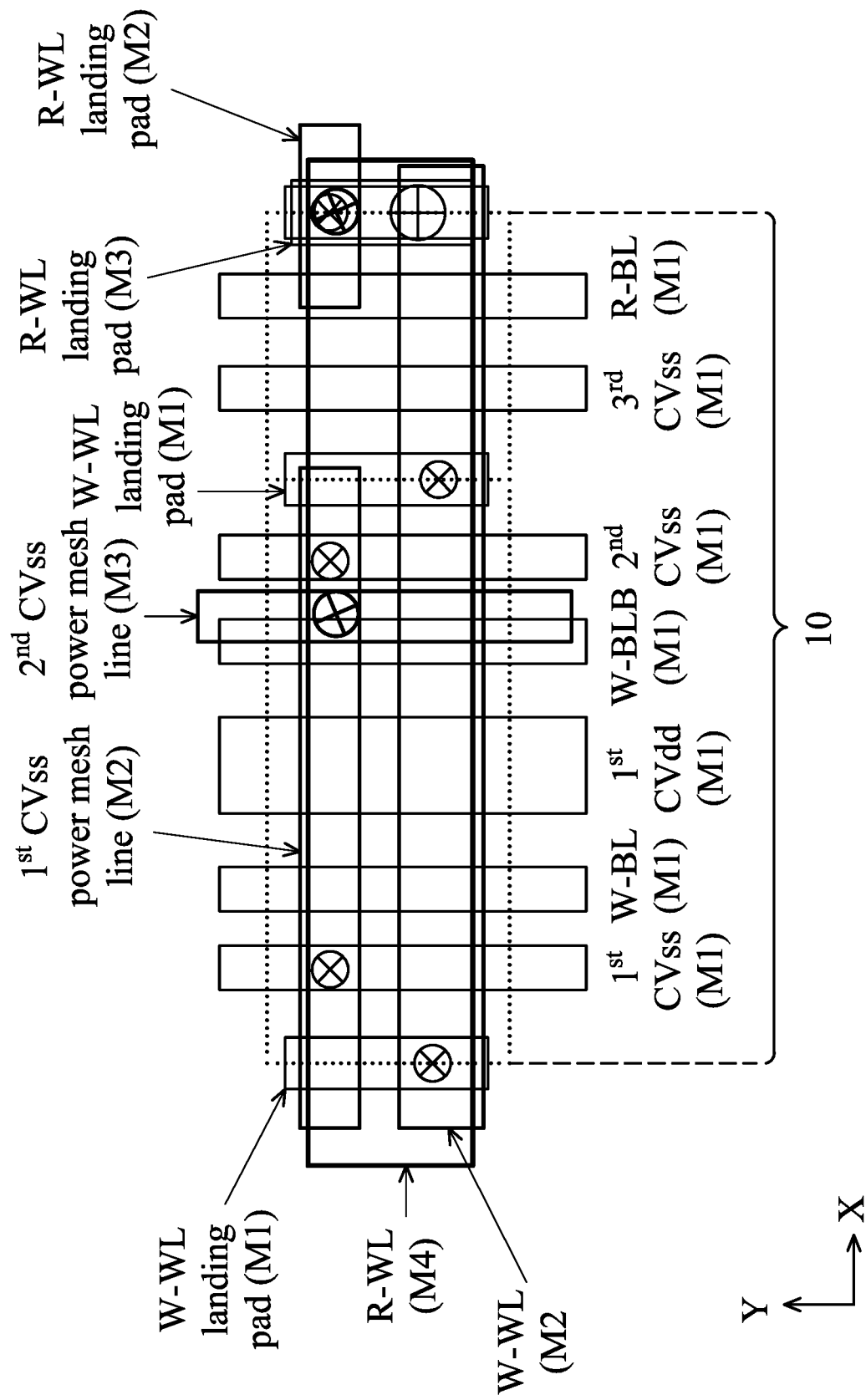
FIGS. 7 through 9 illustrate the layouts of metal lines of an SRAM cell in accordance with some embodiments.

FIG. 7 illustrates the layout of metal lines in accordance with some embodiments. These embodiments are similar to the embodiments shown in FIG. 4, except a first CVss power mesh line is formed at the M2 level, and is connected to a second CVss power mesh line (which may be the same global CVss line in FIG. 6) at the M3 level through a Via_2 via. The first CVss power mesh line is connected to the $1^{st}$ and the $2^{nd}$ CVss lines at the M1 level. It is note that although there is a naming difference between "CVss power mesh line" and "CVss line," both a metal lines for connecting the CVss voltage and may form a power mesh, and the notations may be used interchangeably. In the embodiments shown in FIG. 7, the first CVss power mesh line is in SRAM cells, different from the CVss strap shown in FIG. 6. In accordance with some embodiments, both the first CVss power mesh line in FIG. 7 and the CVss strap in FIG. 6 are formed.

Figure 8:
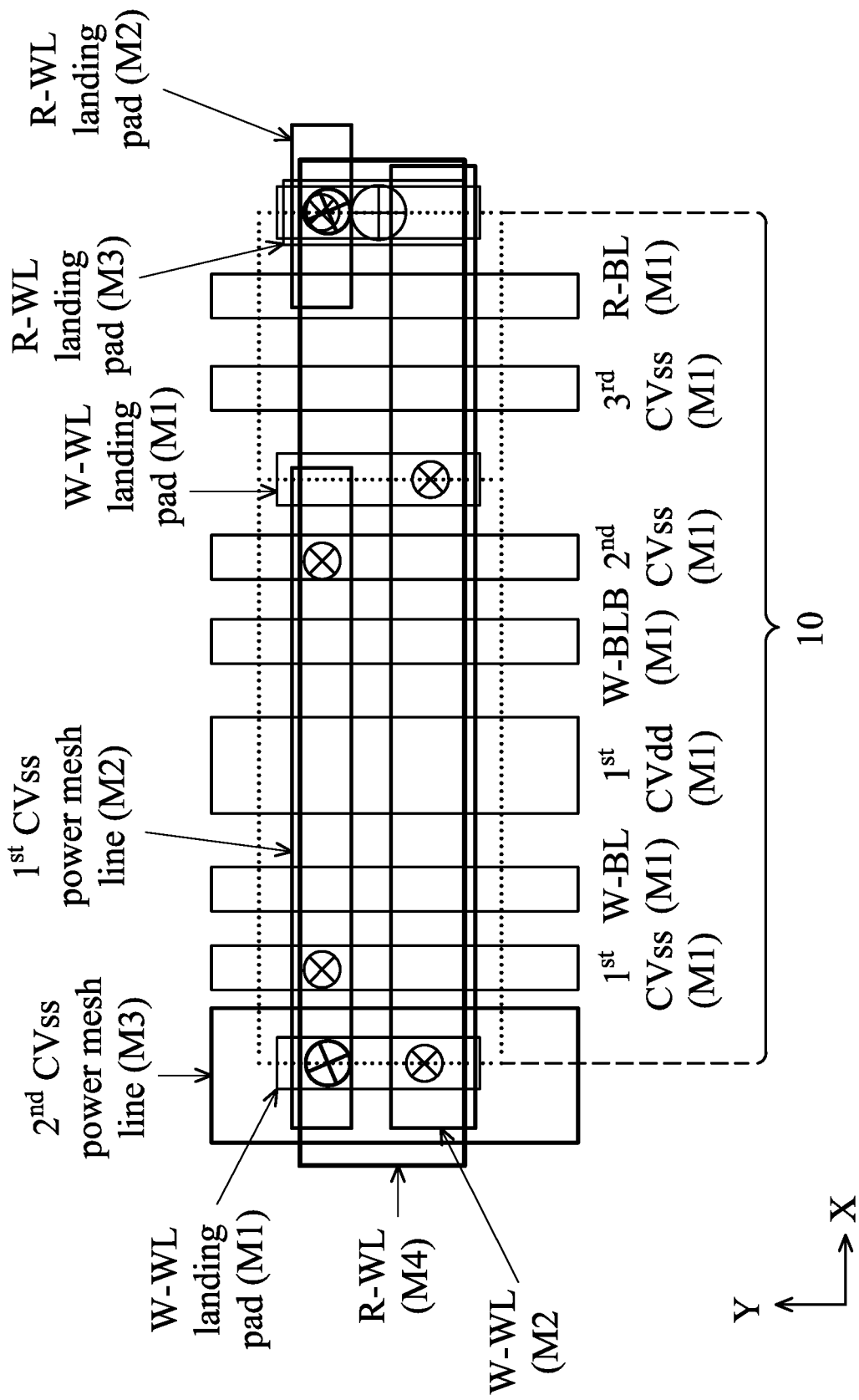

FIG. 8 illustrates the layout of metal lines in accordance with some embodiments. These embodiments are similar to the embodiments shown in FIG. 7, except the second CVss power mesh line (in M3) is formed at the boundary of SRAM 10, and hence is shared by two neighboring columns of SRAM cells 10 in the same SRAM array.

Figure 9:
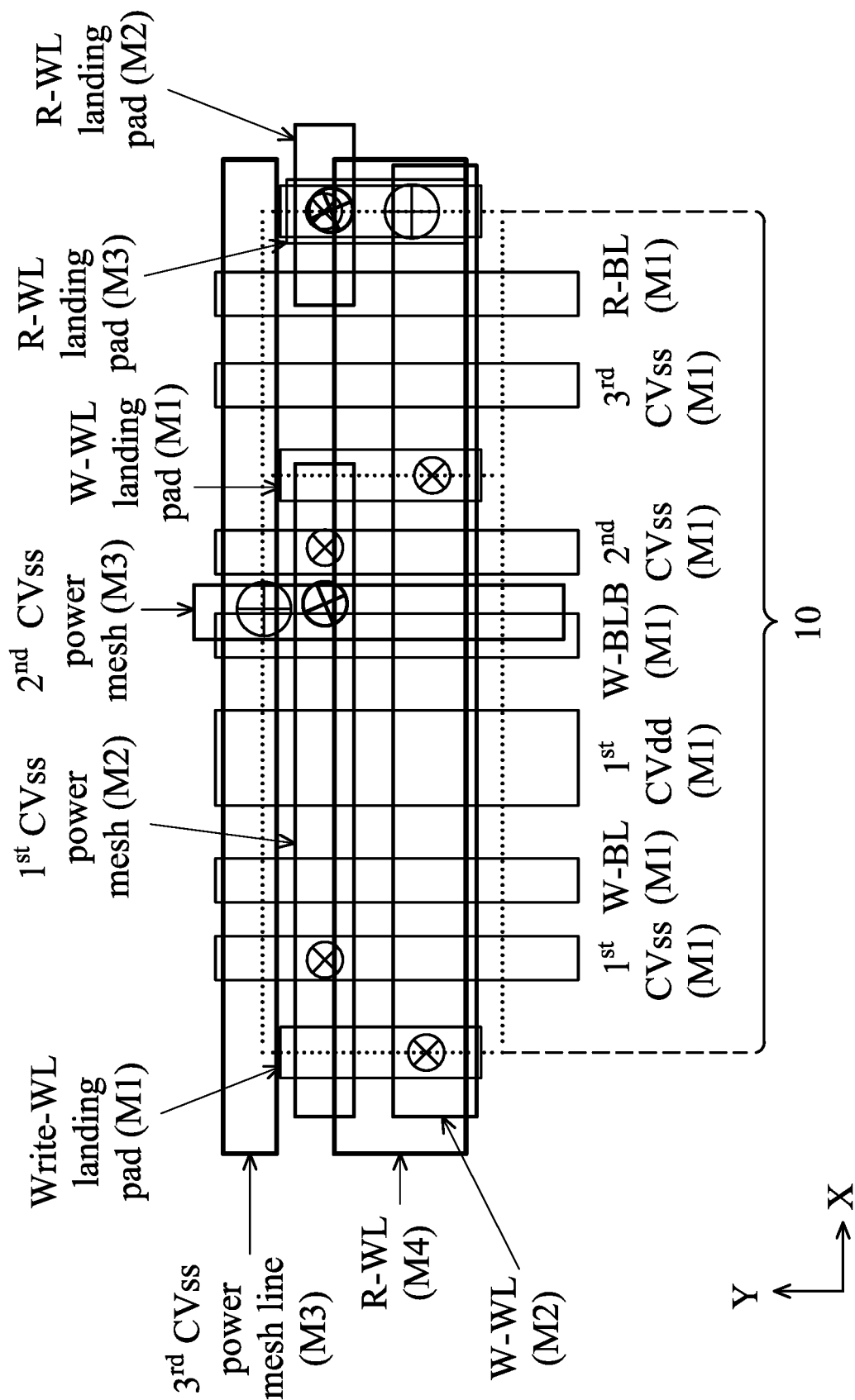

FIG. 9 illustrates the layout of metal lines in accordance with some embodiments. These embodiments are similar to the embodiments shown in FIG. 7, except a third CVss power mesh line is formed at the M3 level. The third CVss power mesh line may be formed at the boundary of SRAM cell 10, and hence is shared by two neighboring rows of SRAM cells 10 in the same SRAM array.

Figure 10:
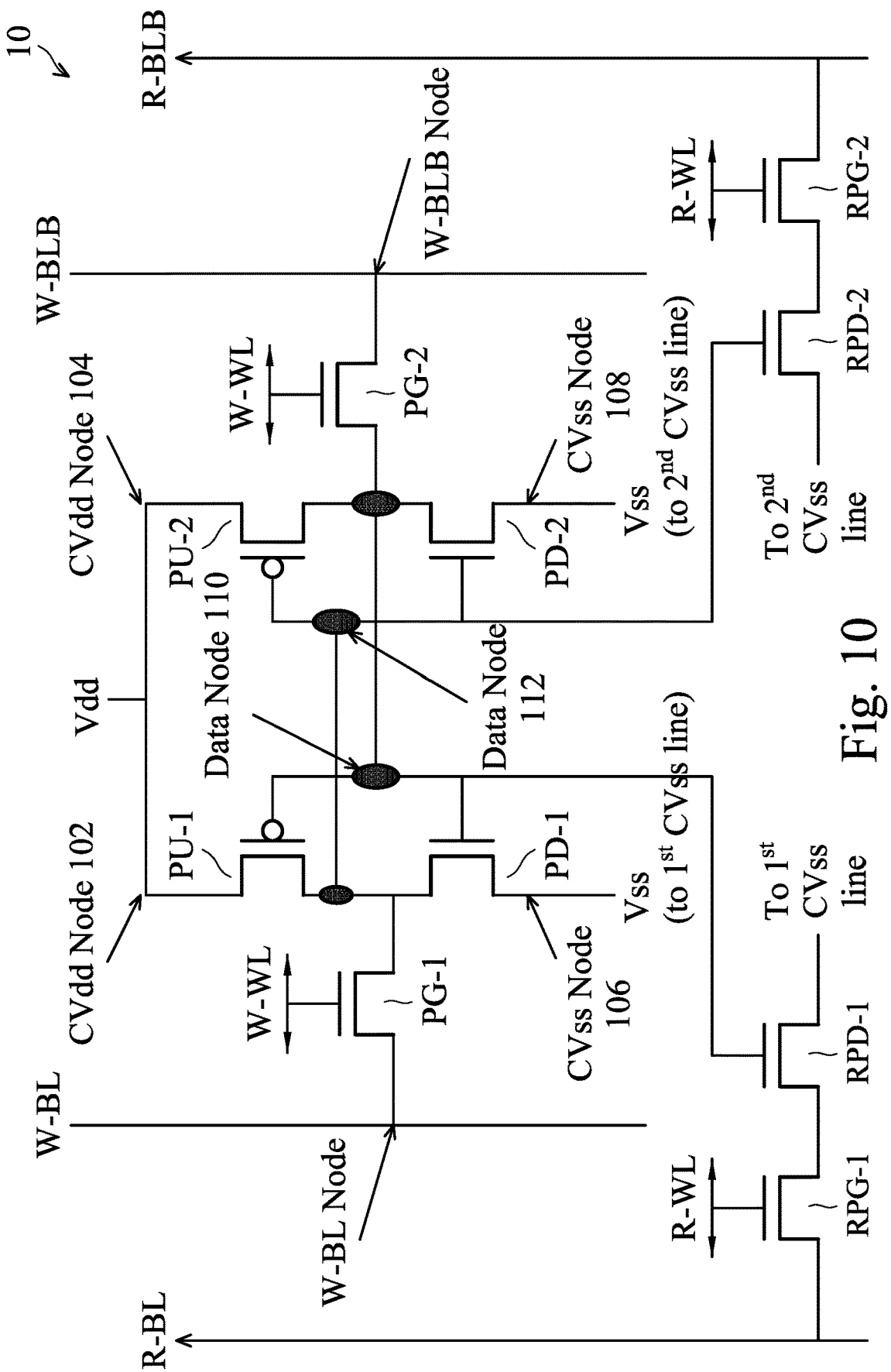
FIG. 10 illustrates a circuit diagram of a two-port ten-transistor (10T) SRAM cell in accordance with some embodiments.

FIG. 10 illustrates a circuit diagram of a two-port ten-transistor (10T) SRAM cell 10 in accordance with some embodiments. The read port of SRAM cell 10 includes a pair of read pull-down transistors RPD-1 and RPD-2, and a pair of read pass-gate transistors RPG-1 and RPG-2. The gates of transistors RPD-1 and RPD-2 are connected to SD nodes 110 and 112, respectively. A source/drain region of transistor RPG-1 is connected to read bit-line R-BL, and a source/drain region of transistor RPG-2 is connected to read bit-line R-BLB, wherein bit-lines R-BL and R-BLB are complementary read bit-lines. The gates of transistors RPG-1 and RPG-2 are connected to the same read word-line R-WL.

Figure 11:
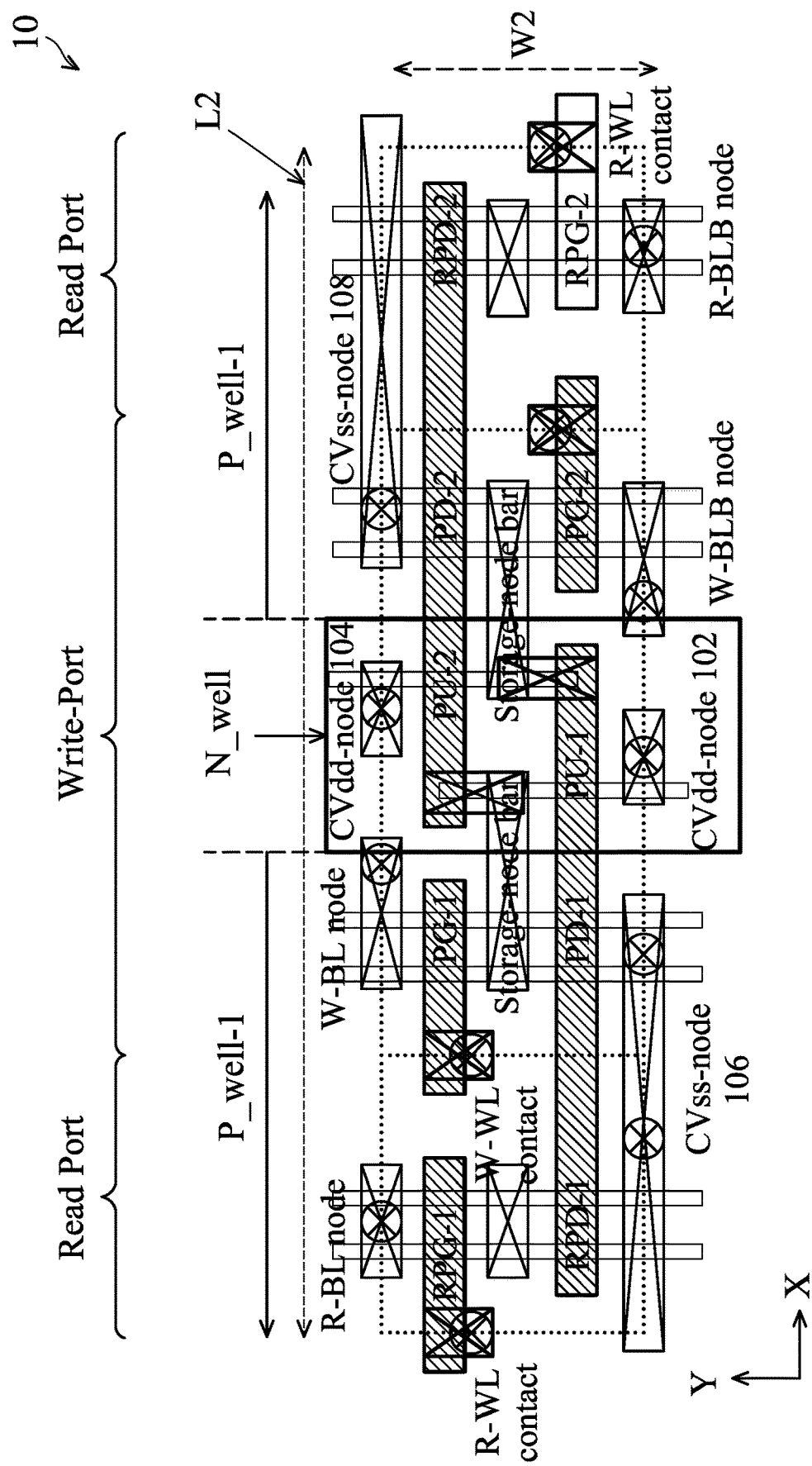
FIG. 11 illustrates a layout of the front-end features of a two-port 10T SRAM cell in accordance with some embodiments.

FIG. 11 illustrates a layout of the front-end features of a two-port 10T SRAM cell 10 in accordance with some exemplary embodiments, wherein the front-end features include the features in the Via_0 level (FIG. 1) and the features underlying the Via_0 level. The layout of the write port and the read port on the right side of the write port (refer to as right-side read port hereinafter) in combination are essentially the same as what are shown in FIG. 3. The read port on the left side of the write port (refer to as left-side read port hereinafter) is essentially the same as the right-side read port, except it is on the left side of write port. Again, the ratio of length L2 to width W2 of SRAM cell 10 is greater than about 3.5 in accordance with some embodiments. The details of the layout may be found referring to the embodiments shown in FIG. 3, and hence is not repeated herein.

Figure 12:
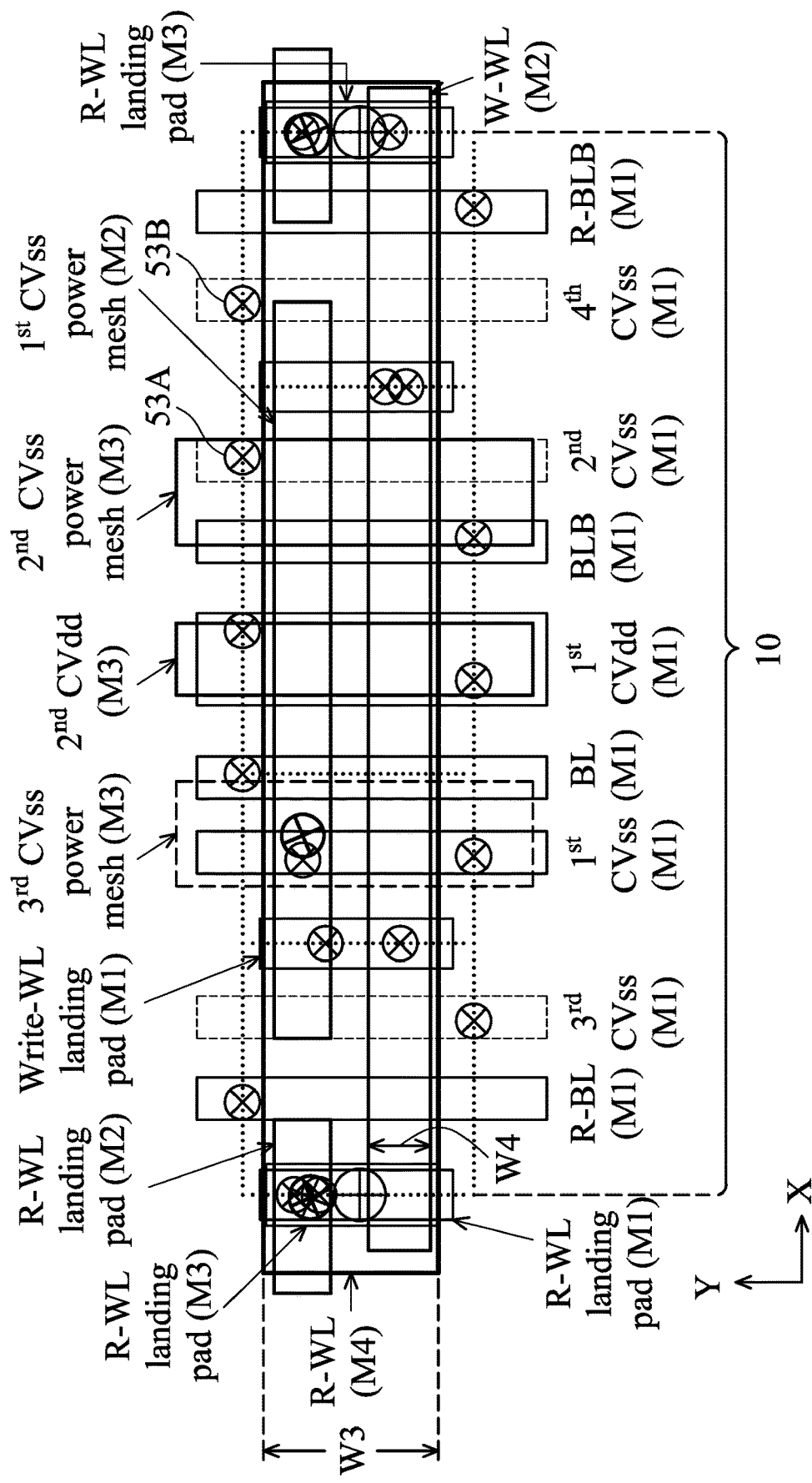
FIGS. 12 and 13 illustrate the layouts of metal lines of an SRAM cell in accordance with some embodiments.
Figure 13:
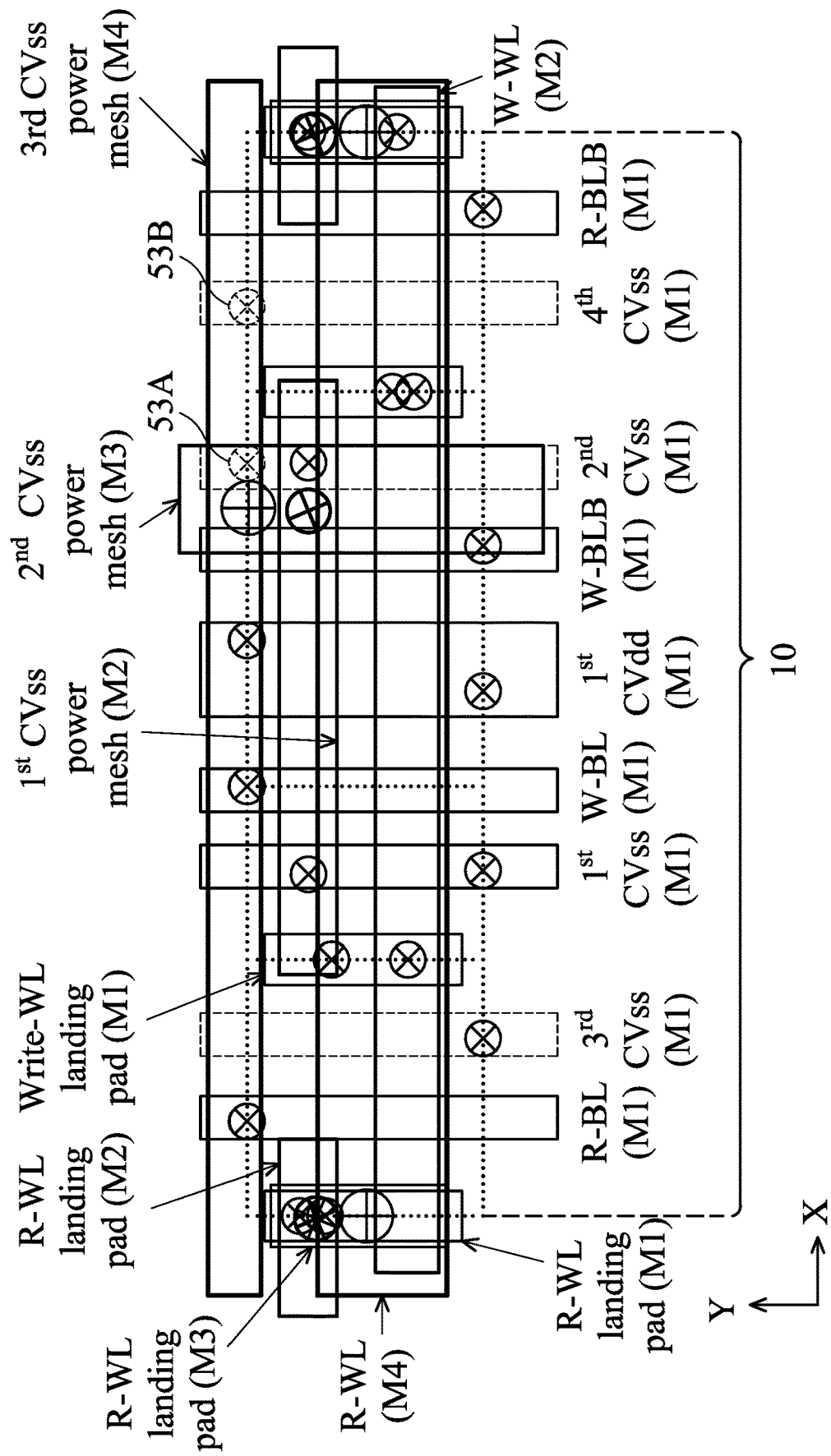

FIG. 12 illustrates the metal lines formed at the M1 level, M2 level, M3 level, and M4 level of the two-port 10T SRAM cell 10. As shown in FIG. 13, a first CVdd line, a $1^{st}$, a $2^{nd}$, $3^{rd}$ and a fourth ($4^{th}$) CVss lines, read bit-lines R-BL and R-BLB, and write bit-lines W-BL and W-BLB are disposed at the M1 level (FIG. 2), and have lengthwise directions parallel to the Y direction. Either one or both of the $2^{nd}$ and 4th CVss lines may be formed, and hence the $2^{nd}$ and $4^{th}$ CVss lines are marked using dashed lines. Accordingly, either one or both of the Via_0 level vias 53A or 53B may be formed in order to connect to the respective overlying $2^{nd}$ and $4^{th}$ CVss lines. A $3^{rd}$ CVdd line may be formed at the M3 level, and connected to the $1^{st}$ CVdd line. The $1^{st}$ the $2^{nd}$, and the $3^{rd}$ power mesh lines are also illustrated, with the corresponding metal levels marked.

Similar to the embodiments as shown in FIG. 4, write word-line W-WL and read word-line R-WL are disposed in different metal layers so that their widths may be maximized in order to reduce the resistance. In accordance with some embodiments of the present disclosure, write word-line W-WL is at the M2 level (FIG. 2), and read word-line R-WL is at the M4 level. Also in accordance with some embodiments, inside SRAM cell 10 and at the M4 level, there is a single R-WL without any other metal line. In accordance with some embodiment, the ratio W3/W4, which is the ratio of width W3 of R-WL to width W4 of W-WL is greater than about 1.5.

FIG. 13 illustrates the layout of metal lines in accordance with some embodiments. These embodiments are similar to the embodiments shown in FIG. 12, except a $3^{rd}$ CVss power mesh line is formed at the M4 level. The $5^{th}$ CVss power mesh line is at the boundary of SRAM 10, and hence is shared by two neighboring columns of SRAM cells 10 in the same SRAM array. The $1^{st}$ and the $2^{nd}$ power mesh lines are also illustrated, with the corresponding metal levels marked.

Figure 14:
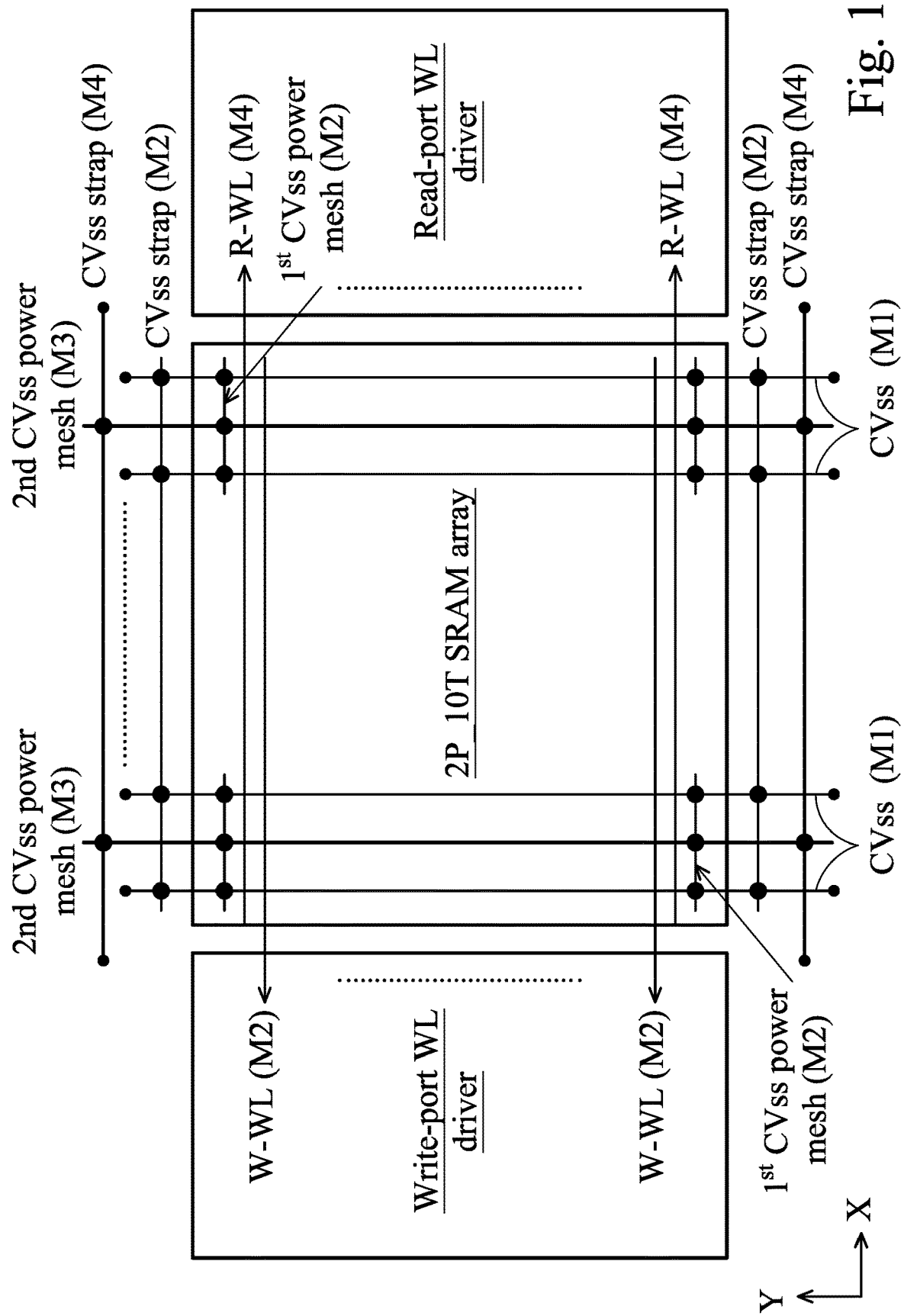
FIG. 14 illustrates the schematic view of the connection of CVss power mesh inside and outside of an SRAM array in accordance with some embodiments.

FIG. 14 schematically illustrates a CVss power mesh in accordance with some embodiments. For example, a two-port (2P) 10T SRAM array includes the $2^{nd}$ CVss power mesh lines (also refer to FIGS. 12 and 13) at the M3 level. At the locations outside of the array (such as the illustrated top side and bottom side), the $2^{nd}$ CVss power mesh lines are connected to CVss straps at the M2 level and the CVss straps at the M4 level. Also, the $2^{nd}$ CVss power lines in M3 level may be connected to the $1^{st}$ CVss power mesh lines at M2 level, which is further connected to the CVss lines at the M1 level, wherein the M1 level CVss lines extend in the Y direction. The respective connections may be inside the SRAM array. The word-lines W-WL (M2) and R-WL (M4) of the SRAM array are connected to a write-port WL driver and a read-port WL driver, respectively.

Figure 15:
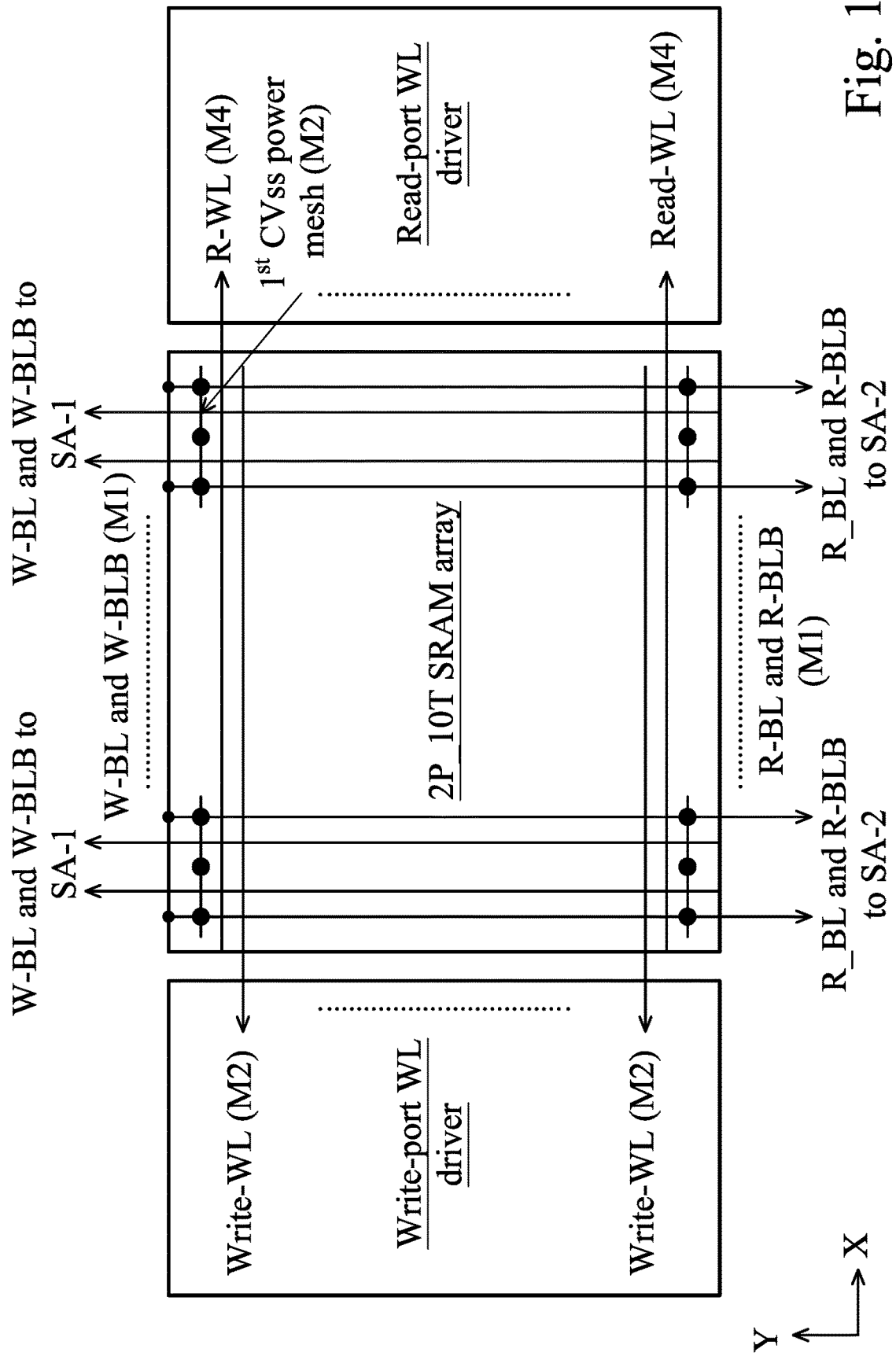
FIG. 15 illustrates the schematic view of the connection of bit-lines of an SRAM array in accordance with some embodiments.

FIG. 15 schematically illustrates a connection scheme for bit-lines (W-BL, W-BLB, R-BL, and R-BLB) of a 2P 10T SRAM array. As shown in FIG. 15, write bit-lines W-BL and W-BLB of the array are connected to sense amplifier SA-1, which may be a global sense amplifier (wherein the sense amplifier SA-1 is shared by the entire column of the array). Read bit-lines R-BL and R-BLB of the array are connected to sense amplifier SA-2, which may be a local sense amplifier (wherein the sense amplifier SA-2 is shared by some, but not all, of SRAM cells in the same column). The word-lines W-WL (M2) and R-WL (M4) of the SRAM array are connected to a write-port WL driver and a read-port WL driver, respectively.

The embodiments of the present disclosure have some advantageous features. By forming read word-line R-WL and write word-line W-WL in different metal lines, the widths of the word-lines may be increased, and the thickness of the write word-line may also be increased, resulting in the advantageous reduction of the resistance of both read word-line and write word-line. The formation of jogs for word-lines also contributes to the reduction of the resistance of the word-line. The CVss power mesh may include portions in M1, M2, M3, and M4 levels to improve the performance of the corresponding SRAM array.

In accordance with some embodiments of the present disclosure, an integrated circuit structure includes a Static Random Access Memory (SRAM) cell, which includes a read port and a write port. The write port includes a first pull-up Metal-Oxide Semiconductor (MOS) device and a second pull-up MOS device, and a first pull-down MOS device and a second pull-down MOS device forming cross-latched inverters with the first pull-up MOS device and the second pull-up MOS device. The integrated circuit structure further includes a first metal layer, with a bit-line, a CVdd line, and a first CVss line in the first metal layer. A second metal layer is over the first metal layer, and a third metal layer is over the second metal layer. A write word-line is in the second metal layer. A read word-line is in the third metal layer.

In accordance with some embodiments of the present disclosure, an integrated circuit structure includes a Static Random Access Memory (SRAM) cell, which includes a read port and a write port. The write port includes a first pull-up Metal-Oxide Semiconductor (MOS) device and a second pull-up MOS device, and a first pull-down MOS device and a second pull-down MOS device forming cross-latched inverters with the first pull-up MOS device and the second pull-up MOS device. The integrated circuit structure further includes a first metal layer, with a bit-line, a CVdd line, and a first CVss line in the first metal layer. A write word-line is in a second metal layer over the first metal layer. The write word-line includes a strip portion having a uniform width across the SRAM cell, and a jog portion on a side of, and connected to, the strip portion. A read word-line is two metal layers higher than the write word-line.

In accordance with some embodiments of the resent disclosure, an integrated circuit structure includes a Static Random Access Memory (SRAM) cell, which includes a read port and a write port. The write port includes a first pull-up Metal-Oxide Semiconductor (MOS) device and a second pull-up MOS device, and a first pull-down MOS device and a second pull-down MOS device forming cross-latched inverters with the first pull-up MOS device and the second pull-up MOS device. The integrated circuit structure further includes a first metal layer, with a bit-line, a CVdd line, and a first CVss line in the first metal layer. A second metal layer is over the first metal layer, with a second CVss line in the second metal layer and extending in a second direction perpendicular to the first direction. A third metal layer is over the second metal layer, with a third CVss line in the third metal layer and extending in the first direction. The first CVss line, the second CVss line, and the third CVss line are electrically interconnected to form a power mesh.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure comprising:
    a Static Random Access Memory (SRAM) cell comprising a read port and a write port;
    a first metal layer, with a CVdd line and a CVss line in the first metal layer and overlapping the SRAM cell;
    a second metal layer over the first metal layer, wherein a write word-line is in the second metal layer and overlaps the SRAM cell, and the write word-line is connected to the write port, and wherein the write word-line is configured to conduct into the write port a first signal at a first time and a second signal complementary to the first signal at a second time, wherein the write word-line has a first lengthwise direction; and
    a third metal layer over the second metal layer, wherein a read word-line is in the third metal layer and is connected to the read port, and wherein the read word-line is configured to conduct out of the read port the first signal at a third time and the second signal at a fourth time different from the third time, with the read word-line overlapping the write word-line, and wherein the read word-line has a second lengthwise direction parallel to the first lengthwise direction.

2. The integrated circuit structure of claim 1 further comprising a fourth metal layer between the second metal layer and the fourth metal layer.

3. The integrated circuit structure of claim 1, wherein in the third metal layer, no additional metal line that is parallel to the read word-line is formed to overlap the SRAM cell.

4. The integrated circuit structure of claim 1, wherein the first metal layer further comprises a read bit-line and a write bit-line, and wherein the write bit-line is wider than the read bit-line.

5. The integrated circuit structure of claim 4, wherein a ratio of a first width of the write bit-line to a second width of the read bit-line is greater than about 1.2.

6. The integrated circuit structure of claim 1, wherein the read word-line is wider than the write word-line.

7. The integrated circuit structure of claim 6, wherein a ratio of a first width of the read word-line to a second width of the write word-line is greater than about 1.5.

8. The integrated circuit structure of claim 1, wherein the SRAM cell comprises a first boundary and a second boundary opposing to each other, and the write word-line comprises:
    a strip portion having a uniform width, wherein the strip portion extends from the first boundary to the second boundary; and
    a jog portion joining to the strip portion, wherein the jog portion extends to the first boundary, and is spaced apart from the second boundary.

9. An integrated circuit structure comprising:
    a plurality of Static Random Access Memory (SRAM) cells forming a row;
    a first word-line overlapping the plurality of SRAM cells, wherein the first word-line comprises:
        a strip portion having a uniform width; and
        a jog portion on a side of the strip portion, wherein the strip portion is physically joined to the jog portion to form a continuous region; and
    a second word-line overlapping the first word-line and the plurality of SRAM cells, wherein the first word-line and the second word-line are configured to have different voltages.

10. The integrated circuit structure of claim 9, wherein the second word-line is a read word-line electrically connecting to read ports of the plurality of SRAM cells, and the first word-line is a write word-line electrically connecting to write ports of the plurality of SRAM cells.

11. The integrated circuit structure of claim 10, wherein a first thickness of the write word-line is greater than a second thickness of the read word-line.

12. The integrated circuit structure of claim 9, wherein the second word-line is wider than the first word-line.

13. The integrated circuit structure of claim 12, wherein a ratio of a first width of the second word-line to a second width of the first word-line is greater than about 1.5.

14. The integrated circuit structure of claim 9, wherein the plurality of SRAM cells are eight-transistor SRAM cells.

15. The integrated circuit structure of claim 9, wherein the plurality of SRAM cells are ten-transistor SRAM cells.

16. An integrated circuit structure comprising:
    a first Static Random Access Memory (SRAM) cell comprising a first port;
    a second SRAM cell comprising a second port;
    a bit-line extending in a first direction, wherein the bit-line overlaps a portion of the SRAM cell;
    a first word-line over and electrically connected to the first port and the second port, wherein the first word-line extends in a second direction perpendicular to the first direction, and the first word-line comprises:
  a jog portion overlapping both of the first SRAM cell and the second SRAM cell, the jog portion comprising an edge, wherein the edge is parallel to the first direction, and the edge is between two boundaries of the first SRAM cell; and
a second word-line, wherein an entirety of the jog portion of the first word-line is overlapped by the second word-line.

17. The integrated circuit structure of claim 16, wherein the first word-line further comprises a strip portion extends to both of the two boundaries of the first SRAM cell, with the strip portion having a uniform width.

18. The integrated circuit structure of claim 17, wherein the second word-line further overlaps a portion of the strip portion.

19. The integrated circuit structure of claim 16, wherein lengthwise directions of the first word-line and the second word-line are parallel to each other.

20. The integrated circuit structure of claim 16, wherein the first word-line is a write word-line, and the second word-line is a read word-line.

\* \* \* \* \*